United States Patent
Hosokawa et al.

(10) Patent No.: US 6,534,199 B1
(45) Date of Patent: Mar. 18, 2003

(54) ORGANIC ELECTROLUMINESCENCE DEVICE AND ORGANIC LIGHT EMITTING MEDIUM

(75) Inventors: Chishio Hosokawa, Chiba-ken (JP); Hisahiro Higashi, Chiba-ken (JP); Kenichi Fukuoka, Chiba-ken (JP); Hidetsugu Ikeda, Chiba-ken (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 0 days.

(21) Appl. No.: 09/665,416

(22) Filed: Sep. 20, 2000

(30) Foreign Application Priority Data

Sep. 21, 1999 (JP) .............................. 11-267460

(51) Int. Cl.$^7$ .......................... H05B 33/14; C09K 11/06
(52) U.S. Cl. ...................... 428/690; 428/917; 313/504; 313/506; 252/301.16
(58) Field of Search ................. 428/690, 704, 428/917; 313/504, 506; 252/301.16

(56) References Cited

U.S. PATENT DOCUMENTS

| | | | | |
|---|---|---|---|---|
| 5,536,949 A | * | 7/1996 | Hosokawa et al. | 257/40 |
| 5,635,308 A | * | 6/1997 | Inoue et al. | 428/690 |
| 5,652,067 A | * | 7/1997 | Ito et al. | 428/690 |
| 5,739,635 A | * | 4/1998 | Wakimoto | 313/504 |
| 5,935,721 A | * | 8/1999 | Shi et al. | 428/690 |
| 5,981,092 A | * | 11/1999 | Arai et al. | 428/690 |
| 6,140,763 A | * | 10/2000 | Hung et al. | 313/503 |

FOREIGN PATENT DOCUMENTS

| | | |
|---|---|---|
| EP | 836366 | 4/1998 |
| JP | 9-268284 | 10/1997 |
| JP | 11-74079 | 3/1999 |
| JP | 2000-164363 | 6/2000 |

* cited by examiner

*Primary Examiner*—Marie Yamnitzky
(74) *Attorney, Agent, or Firm*—Oblon, Spivak, McClelland, Maier & Neustadt, P.C.

(57) ABSTRACT

An organic electroluminescence device which exhibits excellent heat resistance, a long life and a high efficiency and emits bluish light and an organic light emitting medium advantageously used for the organic electroluminescence device. The organic electroluminescence device comprises a layer of an organic light emitting medium which is disposed between a pair of electrodes and comprises (A) a mono-, di-, tri- or tetrastyryl derivative containing amine and (B) an anthracene derivative having a specific structure. The organic light emitting medium comprises components (A) and (B).

9 Claims, No Drawings

ORGANIC ELECTROLUMINESCENCE DEVICE AND ORGANIC LIGHT EMITTING MEDIUM

TECHNICAL FIELD

The present invention relates to an organic electroluminescence device ("electroluminescence" will be referred to as EL, hereinafter) and an organic light emitting medium, and more particularly to an organic EL device which exhibits excellent heat resistance, a long life and a high efficiency and emits bluish light and an organic light emitting medium advantageously used for the organic electroluminescence device.

BACKGROUND ART

Electroluminescence devices which utilize electroluminescence show high self-distinguishability because of the self-emission and are excellent in impact resistance because they are completely solid devices. Therefore, electroluminescence devices have been attracting attention for application as light emitting devices in various types of display apparatus.

The electroluminescence devices include inorganic electroluminescence devices in which an inorganic compound is used as the light emitting material and organic electroluminescence devices in which an organic compound is used as the light emitting material. Organic electroluminescence devices have been extensively studied for practical application as a display device of the next generation because the applied voltage can be decreased to a large extent, the size of the device can be reduced easily, consumption of electric power is small, planar light emission is possible and three primary colors are easily emitted.

As for the construction of the organic electroluminescence device, the basic construction comprises an anode/an organic light emitting layer/a cathode. Constructions having a hole injecting and transporting layer or an electron injecting layer suitably added to the basic construction are known. Examples of such construction include the construction of an anode/a hole injecting and transporting layer/an organic light emitting layer/a cathode and the construction of an anode/a hole injecting and transporting layer/an organic light emitting layer/an electron injecting layer/a cathode.

In practical application of organic EL devices, driving stability and storage stability in environments at high temperatures such as outdoors and in automobiles are required. When an EL device is used outdoors or for an instrument used in an automobile, in general, storage stability at a high temperature of 75° C. is required. However, when a conventional organic EL device is stored at a high temperature of about 75° C., problems arise in that color of emitted light changes and the efficiency of light emission decreases. These problems inevitably restrict application of the organic EL devices.

Various attempts have been made to obtain a device which exhibits excellent heat resistance, a long life and a high efficiency and emits bluish light. However, it is the actual present situation that no devices having satisfactory properties are obtained.

For example, a technology in which a single monoanthracene compound is used as the organic light emitting material has been disclosed in Japanese Patent Application Laid-Open No. Heisei 11(1999)-3782. However, in accordance with this technology, for example, the luminance obtained under a current density of 165 mA/cm$^2$ is as small as 1650 cd/m$^2$ and the efficiency is as small as 1 cd/A. Therefore, the technology is not practically useful. Another technology in which a single bisanthracene compound is used as the organic light emitting material has been disclosed in Japanese Patent Application Laid-Open No. Heisei 8(1996)-12600. However, in accordance with this technology, the efficiency is as small as 1 to 3 cd/A and further improvement is desired for practical use. An organic EL device having a long life in which a distyryl compound is used as the organic light emitting material and styrylamine is additionally used has been disclosed in International Patent Application Laid-Open No. 94-6157. However, this device has a half-life of about 1000 hours and further improvement is desired.

DISCLOSURE OF THE INVENTION

Under the above circumstances, the present invention has an object of providing an organic EL device which exhibits excellent heat resistance, a long life and a high efficiency and emits bluish light and an organic light emitting medium advantageously used for the organic EL device.

As the result of extensive studies by the present inventors to achieve the above object, it was found that, when an organic light emitting medium comprises a combination of a mono-, di-, tri- or tetrastyryl derivative containing amine and a specific anthracene derivative, an organic EL device in which a layer comprising this light emitting medium is disposed between a pair of electrodes exhibits excellent heat resistance, a long life and a high efficiency and emits bluish light. The present invention has been completed based on this knowledge.

The present invention provides an organic EL device comprising a pair of electrodes and a layer of an organic light emitting medium which is disposed between the pair of electrodes and comprises (A) at least one compound selected from the group consisting of monostyryl derivatives containing amine, distyryl derivatives containing amine, tristyryl derivatives containing amine and tetrastyryl derivatives containing amine and (B) at least one compound selected from the group consisting of anthracene derivatives represented by general formula (I):

$$A^1\text{—}L\text{—}A^2 \quad\quad (I)$$

wherein $A^1$ and $A^2$ each represent a substituted or unsubstituted monophenylanthryl group or a substituted or unsubstituted diphenylanthryl group and may be the same with or different from each other and L represents a single bond or a divalent linking group; and anthracene derivatives represented by general formula (II):

$$A^3\text{—}An\text{—}A^4 \quad\quad (II)$$

wherein An represents a substituted or unsubstituted divalent anthracene residue group, $A^3$ and $A^4$ each represent a substituted or unsubstituted monovalent condensed aromatic ring group or a substituted or unsubstituted non-condensed ring aryl group having 12 or more carbon atoms and may be the same with or different from each other.

The present invention also provides an organic light emitting medium which comprises (A) at least one compound selected from the group consisting of monostyryl derivatives containing amine, distyryl derivatives containing amine, tristyryl derivatives containing amine and tetrastyryl derivatives containing amine and (B) at least one compound selected from the group consisting of anthracene derivatives represented by general formula (I) shown above and anthracene derivatives represented by general formula (II) shown above.

THE MOST PREFERRED EMBODIMENT TO CARRY OUT THE INVENTION

The organic EL device of the present invention has a structure comprising a pair of electrode and a layer of an organic light emitting medium disposed between the pair of electrode.

In the present invention, a combination of (A) a styryl derivative containing amine and (B) an anthracene derivative having a specific structure is used for the above layer of an organic light emitting medium.

The styryl derivative containing amine of component (A) is at least one compound selected from the group consisting of monostyryl derivatives containing amine, distyryl derivatives containing amine, tristyryl derivatives containing amine and tetrastyryl derivatives containing amine.

In the present invention, a compound having one styryl or styrylene group in the molecule is referred to as a monostyryl derivative, a compound having two styryl or styrylene groups in the molecule is referred to as a distyryl derivative, a compound having three styryl or styrylene groups in the molecule is referred to as a tristyryl derivative and a compound having four styryl or styrylene groups in the molecule is referred to as a tetrastyryl derivative. These compounds in general are referred to as styryl derivatives. The styryl group and the styrylene group mean a monovalent group and a divalent group, respectively, in which substituted or unsubstituted vinyl group is directly bonded to an aromatic ring group. The derivative containing amine means a derivative which contains at least one amino group in the molecule.

Examples of the styryl derivative containing amine of component (A) include styryl derivatives containing amine represented by general formula (III):

(III)

wherein $Ar^3$, $Ar^4$ and $Ar^5$ each independently represent a substituted or unsubstituted aromatic group having 6 to 40 carbon atoms, at least one of the groups represented by $Ar^3$, $Ar^4$ and $Ar^5$ contains styryl group, g represents an integer of 1 to 4 and a total number of styryl group is 1 to 4; and styryl derivatives containing amine represented by general formula (IV):

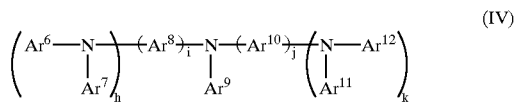

(IV)

wherein $Ar^6$, $Ar^7$, $Ar^9$, $Ar^{11}$ and $Ar^{12}$ each independently represent a substituted or unsubstituted monovalent aromatic group having 6 to 40 carbon atoms, $Ar^8$ and $Ar^{10}$ each independently represent a substituted or unsubstituted divalent aromatic group having 6 to 40 carbon atoms, at least one of the groups represented by $A^6$ to $A^{12}$ contains styryl group or styrylene group, h and k each represent an integer of 0 to 2, i and j each represent an integer of 1 or 2 and a total number of styryl group and styrylene group is 1 to 4.

When $Ar^3$ in the above general formula (III) represents a monovalent aromatic group, examples of the monovalent aromatic group having 6 to 40 carbon atoms which is represented by $Ar^3$, $Ar^4$, $Ar^5$, $Ar^6$, $Ar^7$, $Ar^9$, $Ar^{11}$ or $Ar^{12}$ in the above general formulae (III) and (IV) include phenyl group, naphthyl group, anthranyl group, phenanthryl group, pyrenyl group, coronyl group, biphenyl group, terphenyl group, fluorenyl group, furanyl group, thienyl group, benzothienyl group, indolyl group and carbazolyl group.

When $Ar^3$ in the above general formula (III) represents a divalent aromatic group, examples of the divalent aromatic group include phenylene group, naphthylene group, anthranylene group, phenanthrylene group, pyrenylene group, coronylene group, biphenylene group, terphenylene group, furanylene group, thienylene group and fluorenylene group. When $Ar^3$ in the above general formula (III) represents a group having a functionality of three or greater, examples of the group having a functionality of three or greater include residue groups having a functionality of three or greater which are derived from benzene, naphthalene, anthracene, phenanthrene, pyrene, coronene, biphenyl, terphenyl, furan, thiophene and fluorene.

In the above general formula (IV), examples of the divalent aromatic group having 6 to 40 carbon atoms which is represented by $Ar^8$ or $Ar^{10}$ include phenylene group, naphthylene group, anthranylene group, phenanthrylene group, pyrenylene group, coronylene group, biphenylene group, terphenylene group, furanylene group, thienylene group and fluorenylene group.

In the above general formulae (III) and (IV), further examples of the above monovalent or divalent aromatic group having 6 to 40 carbon atoms include monovalent and divalent residue groups derived from stilbene, distyrylarylenes, tristyrylarylenes and tetrastyrylarylenes.

When the above aromatic group has a substituent, examples of the substituent include alkyl groups having 1 to 6 carbon atoms, cycloalkyl groups having 3 to 6 carbon atoms, alkoxy groups having 1 to 6 carbon atoms, aryloxy groups having 5 to 18 carbon atoms, aralkyloxy groups having 7 to 18 carbon atoms, amino groups substituted with aryl groups having 5 to 16 carbon atoms, nitro group, cyano group, ester groups having 1 to 6 carbon atoms and halogen atoms.

Examples of the alkyl group having 1 to 6 carbon atoms include methyl group, ethyl group, propyl group, isopropyl group, butyl group, isobutyl group, sec-butyl group, tert-butyl group, various types of pentyl groups and various types of hexyl groups. Examples of the alkoxy group having 1 to 6 carbon atoms include methoxy group, ethoxy group, propoxy group, isopropoxy group, butoxy group, isobutoxy group, sec-butoxy group, tert-butoxy group, various types of pentyloxy groups and various types of hexyloxy groups. Examples of the cycloalkyl group having 3 to 6 carbon atoms include cyclopropyl group, cyclobutyl group, cyclopentyl group and cyclohexyl group. Examples of the aryloxy group having 5 to 18 carbon atoms include phenoxy group, tolyloxy group and naphthyloxy group. Examples of the aralkyloxy group having 7 to 18 carbon atoms include benzyloxy group, phenetyloxy group and naphthylmethoxy group. Examples of the amino group substituted with aryl groups having 5 to 16 carbon atoms include diphenylamino group, ditolylamino group, dinaphthylamino group and naphthylphenylamino group. Examples of the ester having 1 to 6 carbon atoms include methoxycarbonyl group, ethoxycarbonyl group, propoxycarbonyl group and isopropoxycarbonyl group. Examples of the halogen atom include fluorine atom, chlorine atom and bromine atom. The aryl group in the present invention includes alkenylaryl groups such as styrylphenyl group, styrylbiphenyl group and styrylnaphthyl group.

In the present invention, the styryl derivative containing amine of component (A) may be used singly or in combination or two or more.

In the present invention, the anthracene derivative of component (B) which is used for the layer of an organic light emitting medium is at least one compound selected from the group consisting of anthracene derivatives represented by general formula (I):

$$A^1-L-A^2 \quad (I)$$

wherein $A^1$ and $A^2$ each represent a substituted or unsubstituted monophenylanthryl group or a substituted or unsubstituted diphenylanthryl group and may be the same with or different from each other and L represents a single bond or a divalent linking group; and anthracene derivatives represented by general formula (II):

$$A^3-An-A^4 \quad (II)$$

wherein An represents a substituted or unsubstituted divalent anthracene residue group, $A^3$ and $A^4$ each represent a substituted or unsubstituted monovalent condensed aromatic ring group or a substituted or unsubstituted non-condensed ring aryl group having 12 or more carbon atoms and may be the same with or different from each other.

When any of the groups in general formulae (I) and (II) shown above has a substituent, examples of the substituent include the same groups and atoms which are described above as the examples of the substituent in general formulae (III) and (IV).

Preferable examples of the anthracene derivative represented by general formula (I) include anthracene derivatives represented by general formula (I-a):

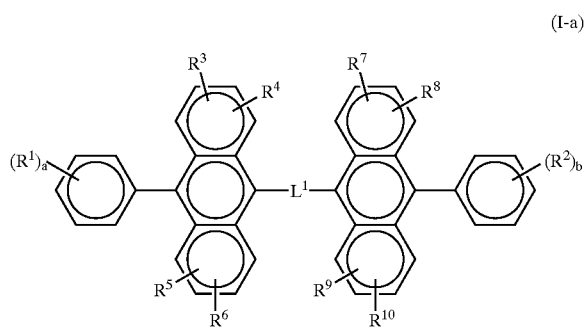

wherein $R^1$ to $R^{10}$ each independently represent hydrogen atom, an alkyl group, a cycloalkyl group, an aryl group which may be substituted, an alkoxy group, an aryloxy group, an alkylamino group, arylamino group or a heterocyclic group which may be substituted; a and b each represent an integer of 1 to 5; when any of a and b represents an integer of 2 or greater, a plurality of $R^1$ or $R^2$ may be the same with or different from each other and a plurality of $R^1$ or $R^2$ may be bonded to each other to form a ring; $R^3$ and $R^4$, $R^5$ and $R^6$, $R^7$ and $R^8$, and $R^9$ and $R^{10}$ may be bonded to each other to form rings; and $L^1$ represents a single bond, —O—, —S—, —N(R)— or an arylene group, R representing an alkyl group or an aryl group which may be substituted; and anthracene derivatives represented by general formula (I-b):

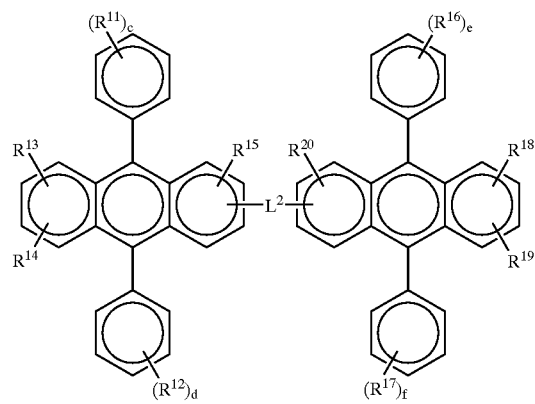

wherein $R^{11}$ to $R^{20}$ each independently represent hydrogen atom, an alkyl group, a cycloalkyl group, an aryl group which may be substituted, an alkoxy group, an aryloxy group, an alkylamino group, an arylamino group or a heterocyclic group which may be substituted; c, d, e and f each represent an integer of 1 to 5; when any of c, d, e and f represents an integer of 2 or greater, a plurality of $R^{11}$, $R^{12}$, $R^{16}$ or $R^{17}$ may be the same with or different from each other and a plurality of $R^{11}$, $R^{12}$, $R^{16}$ or $R^{17}$ may be bonded to each other to form a ring; $R^{13}$ and $R^{14}$, and $R^{18}$ and $R^{19}$ may be bonded to each other to form rings; $L^2$ represents a single bond, —O—, —S—, —N(R)— or an arylene group, R representing an alkyl group or an aryl group which may be substituted.

In the above, a group which may be substituted means a group which is substituted or unsubstituted.

As for the groups represented by $R^1$ to $R^{20}$ in general formulae (I-a) and (I-b) shown above, preferable examples of the alkyl group include alkyl groups having 1 to 6 carbon atoms, preferable examples of the cycloalkyl group include cycloalkyl group having 3 to 6 carbon atoms, preferable examples of the aryl group include aryl groups having 5 to 18 carbon atoms, preferable examples of the alkoxy group include alkoxy groups having 1 to 6 carbon atoms, preferable examples of the aryloxy group include aryloxy groups having 5 to 18 carbon atoms, preferable examples of the arylamino group include amino group substituted with aryl groups having 5 to 16 carbon atoms, and preferable examples of the heterocyclic group include triazole group, oxadiazole group, quinoxaline group, furanyl group and thienyl group.

As for the group represented by R in —N(R)— which is represented by $L^1$ or $L^2$, preferable examples of the alkyl group include alkyl groups having 1 to 6 carbon atoms and preferable examples of the aryl group include aryl groups having 5 to 18 carbon atoms.

Preferable examples of the anthracene derivative represented by general formula (II) shown above include anthracene derivatives represented by general formula (II-a):

$$Ar^1-An-Ar^2 \quad (II\text{-}a)$$

wherein An represents a substituted or unsubstituted divalent anthracene residue group and $Ar^1$ and $Ar^2$ each independently represent a substituted or unsubstituted monovalent residue group derived from naphthalene, phenanthrene, anthracene, pyrene, perylene, coronene, chrysene, picene, fluorene, terphenyl, diphenylanthracene, biphenyl, N-alkylcarbazole, N-arylcarbazole, triphenylene, rubicene, benzoanthracene or dibenzoanthracene.

When any of the groups represented by An, $Ar^1$ and $Ar^2$ in general formula (II-a) shown above has a substituent, examples of the substituent include the same groups and atoms which are described above as the examples of the substituent in general formulae (III) and (IV).

In the present invention, the anthracene derivative of component (B) may be used singly or in combination of two or more.

Specific examples of the anthracene derivative represented by general formula (I-a) are shown in the following.

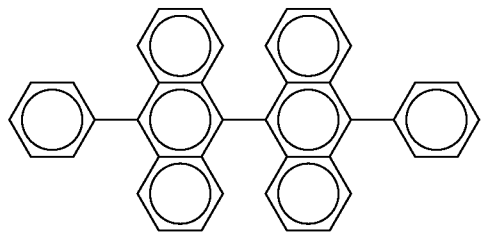

EM1

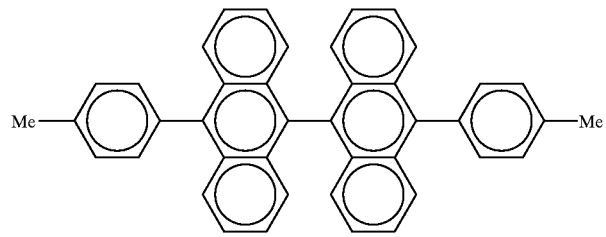

EM2

(Me: methyl group; the same in the following formulae)

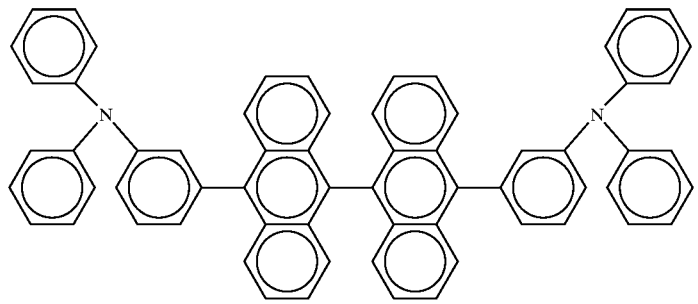

EM3

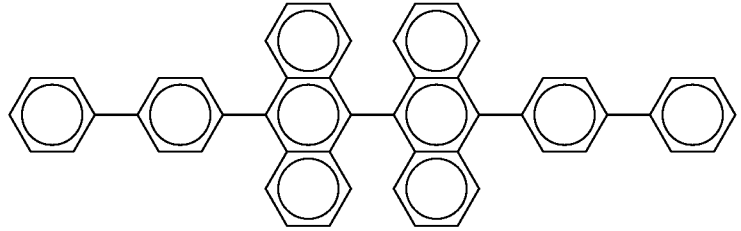

EM4

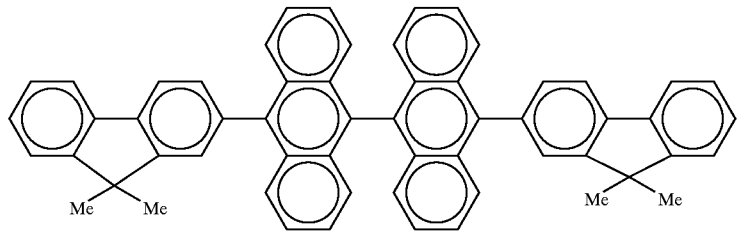

EM5

-continued
EM6
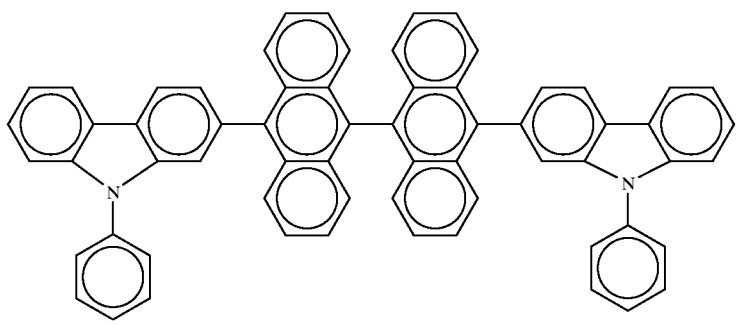
EM7
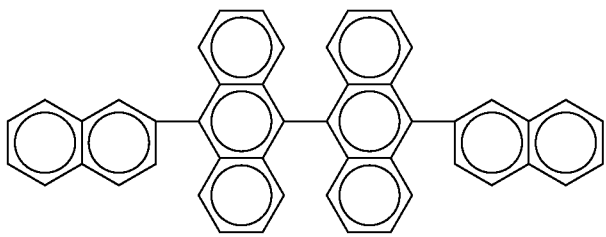
EM8
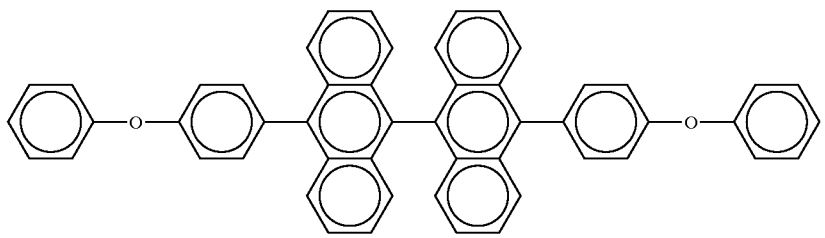
EM9
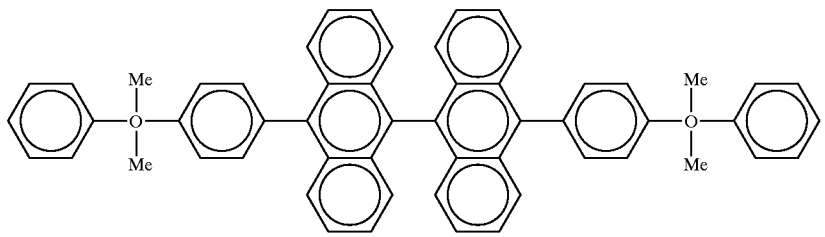
EM10
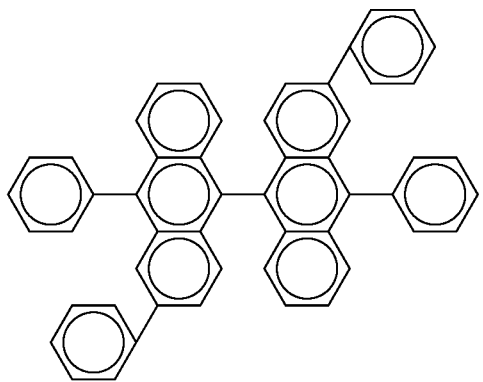

Specific examples of the anthracene derivative represented by general formula (I-b) are shown in the following.
EM11
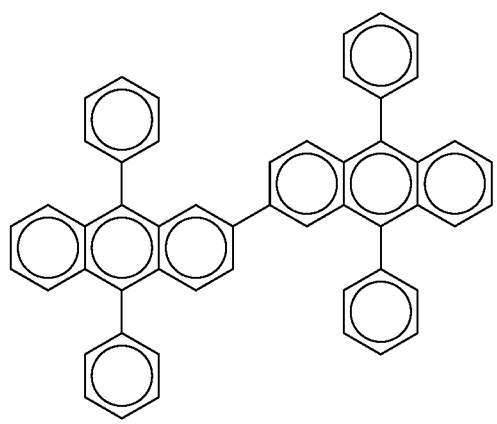
EM12
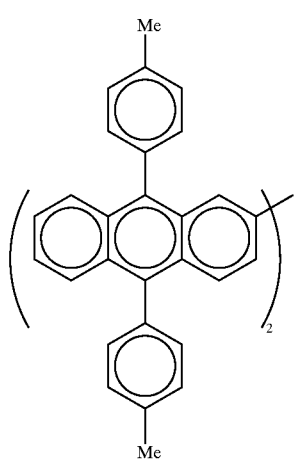
EM13
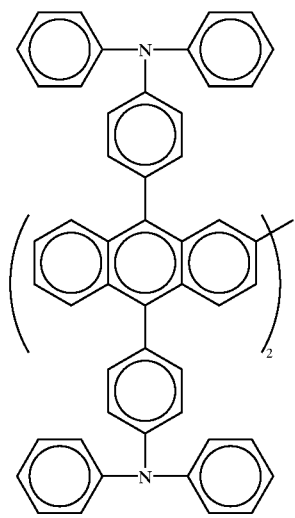
EM14
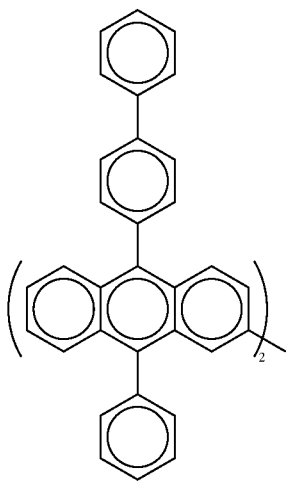
EM15
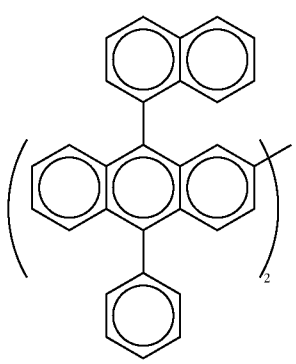
EM16
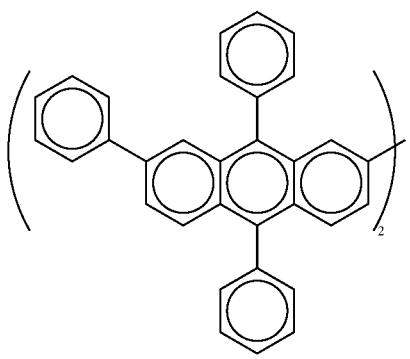
EM17
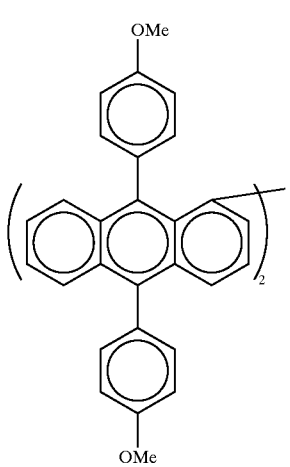

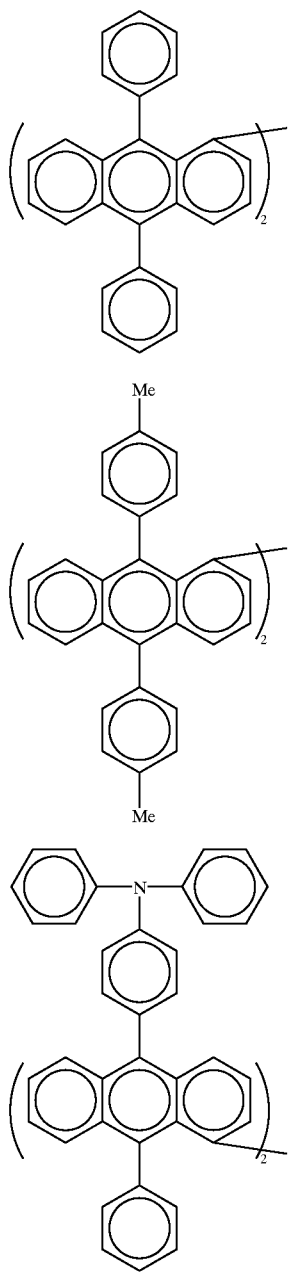
EM18
EM19
EM20
Specific examples of the anthracene derivative represented by general formula (II-a) are shown in the following.
EM21
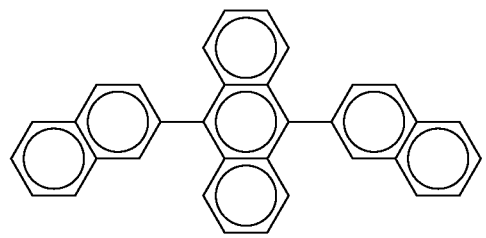
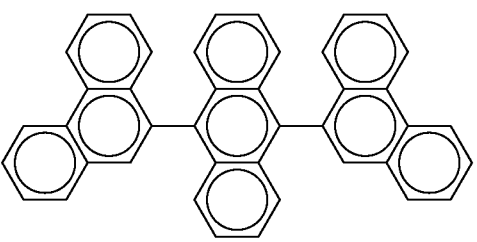
EM22
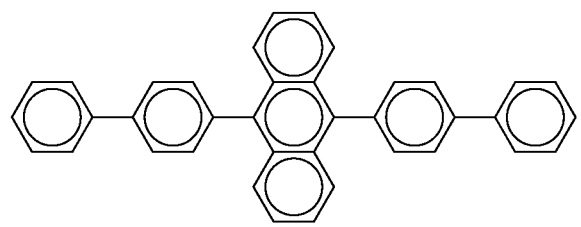
EM23
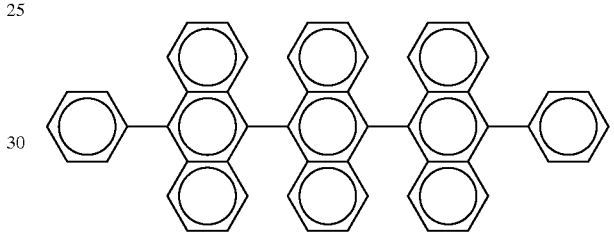
EM24
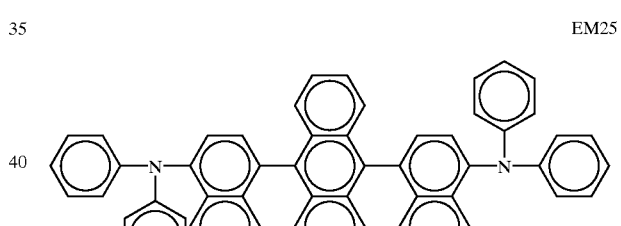
EM25
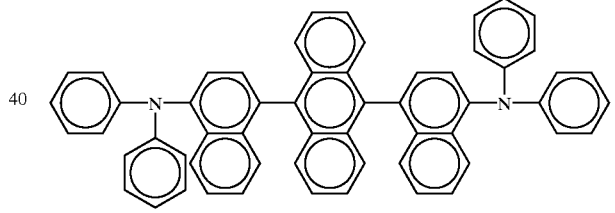
EM26
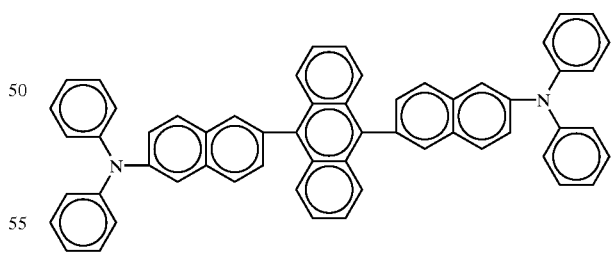
EM27
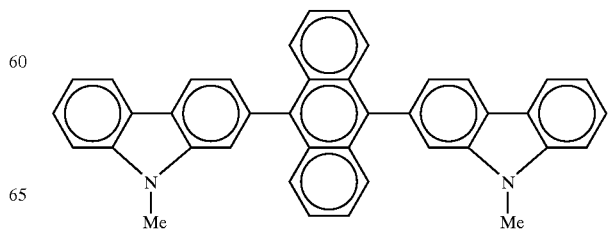

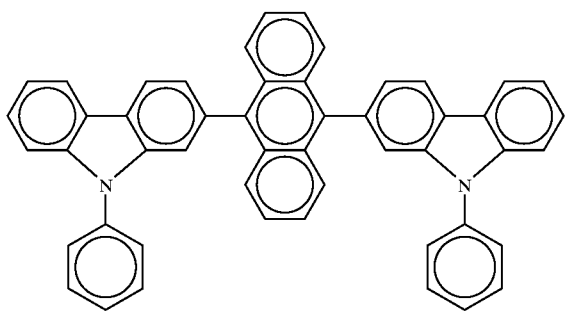
EM28
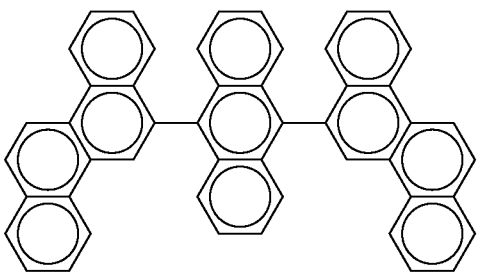
EM30
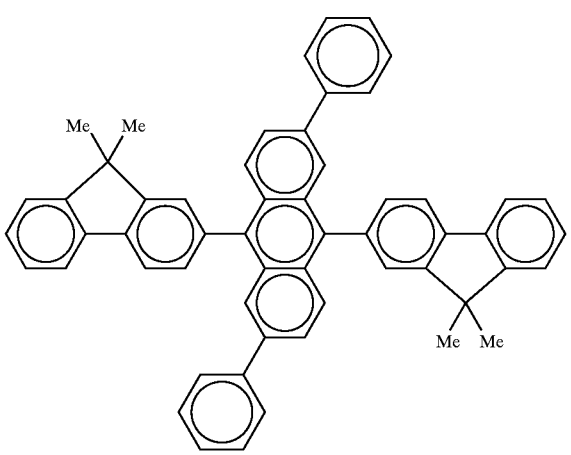
EM29
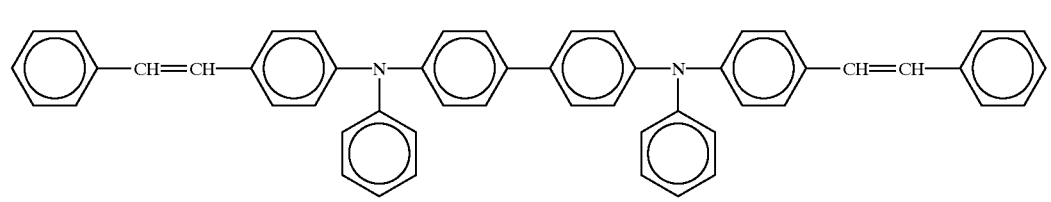
EM31
Specific examples of the styryl derivative containing amine which is represented by general formula (III) are shown in the following.
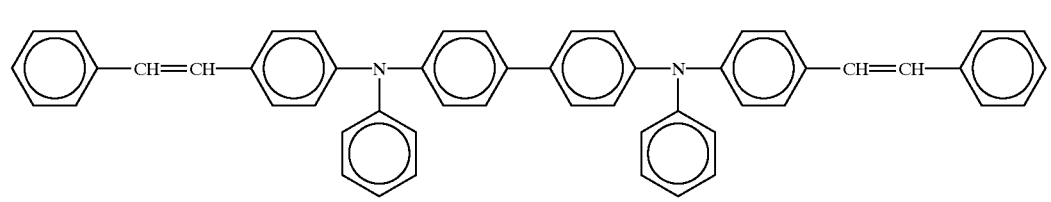
EM32
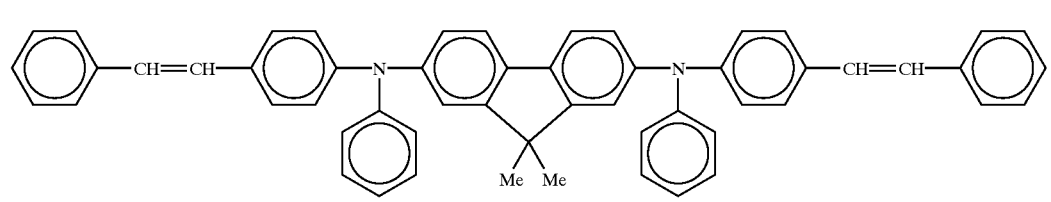
EM33
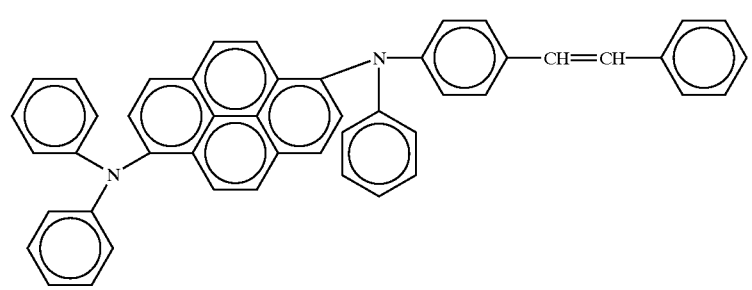
EM34

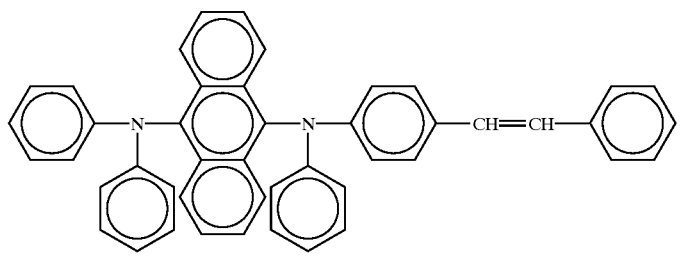
EM35
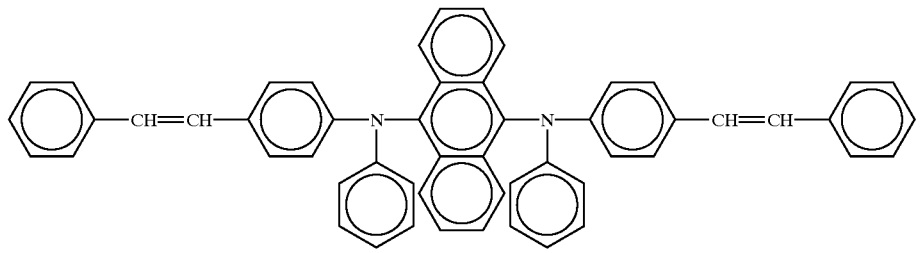
EM36
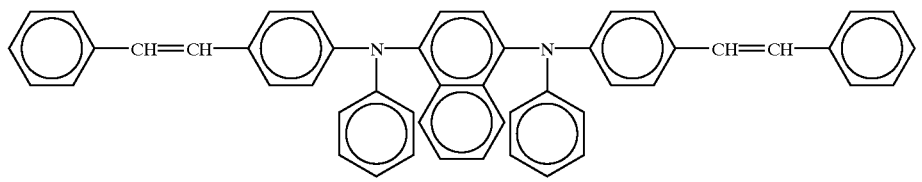
EM37
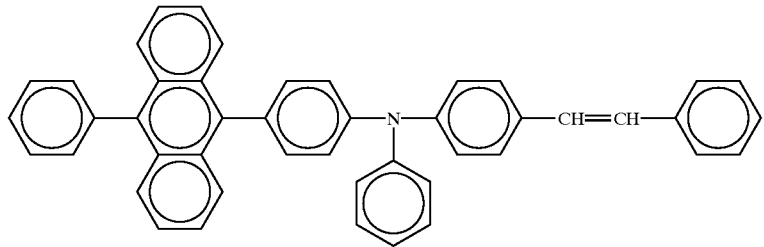
EM38
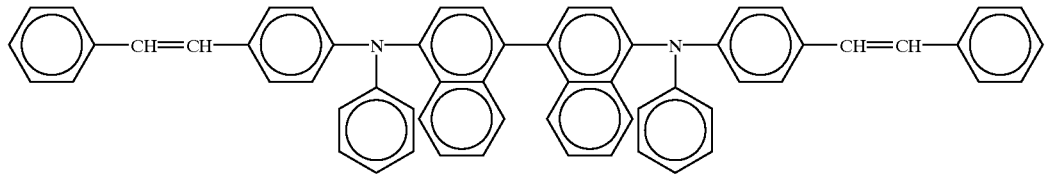
EM39
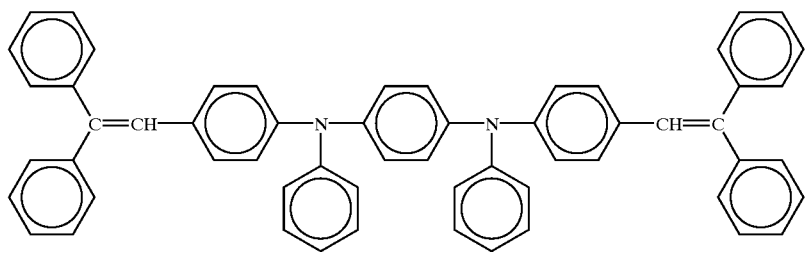
EM40

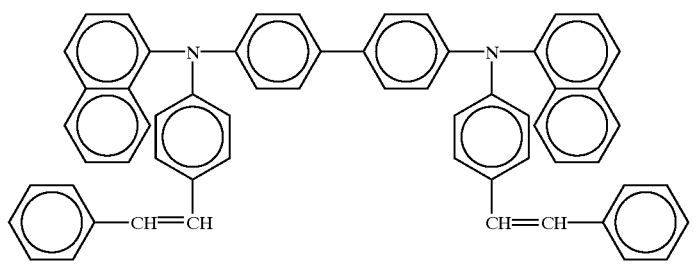
EM41
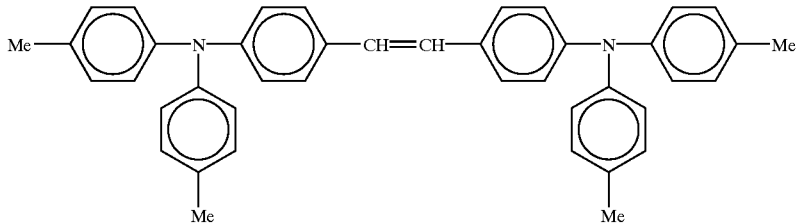
EM42
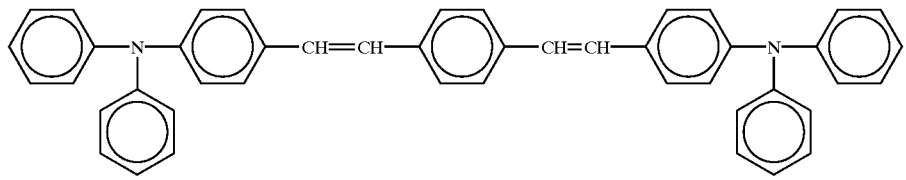
EM43
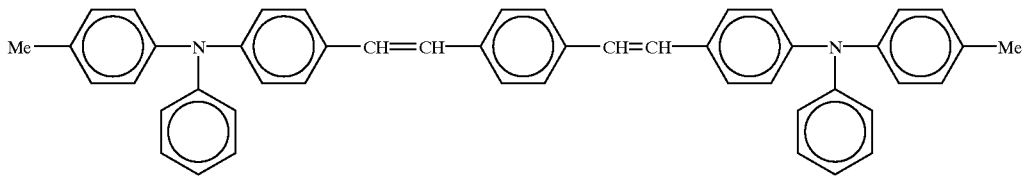
EM44
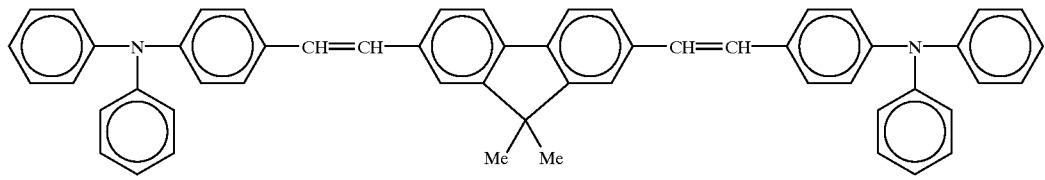
EM45
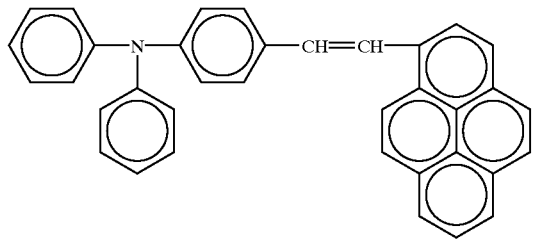
EM46
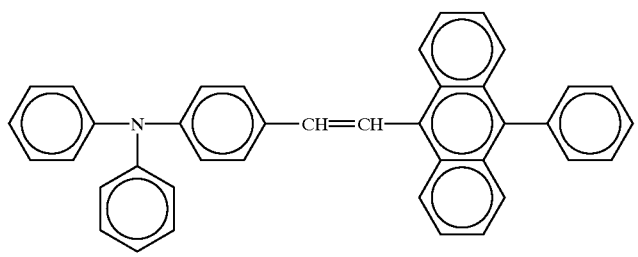
EM47

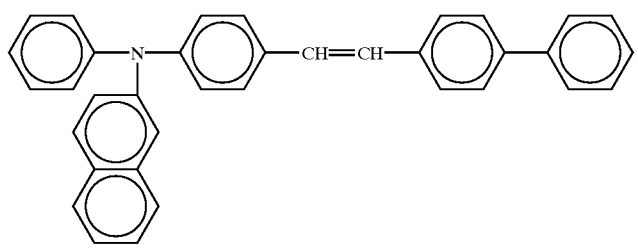
EM48
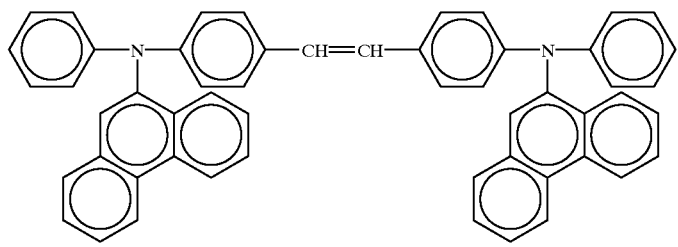
EM49
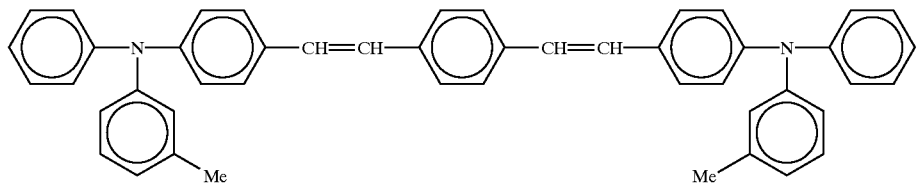
EM50
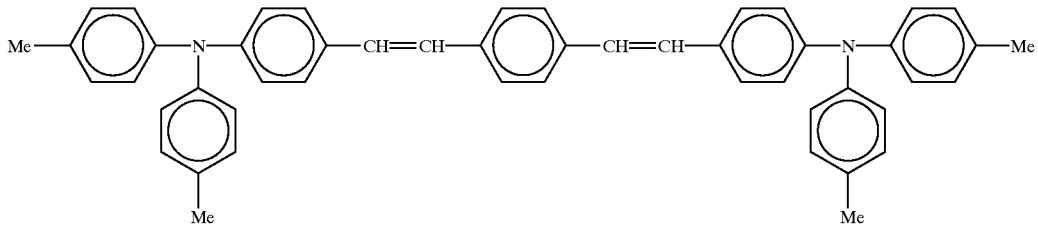
EM51
Specific examples of the styryl derivative containing amine which is represented by general formula (IV) are shown in the following.
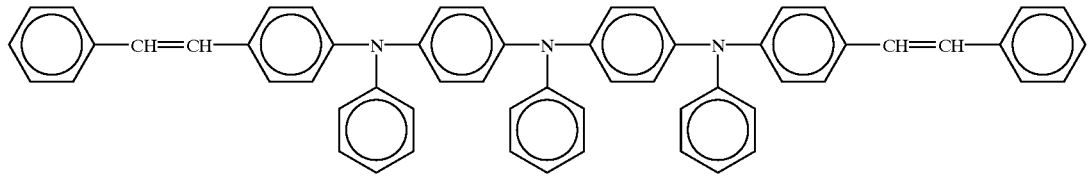
EM52
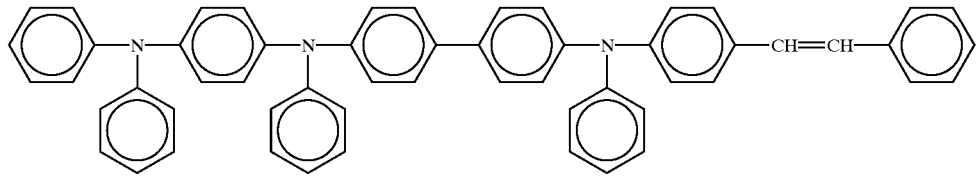
EM53
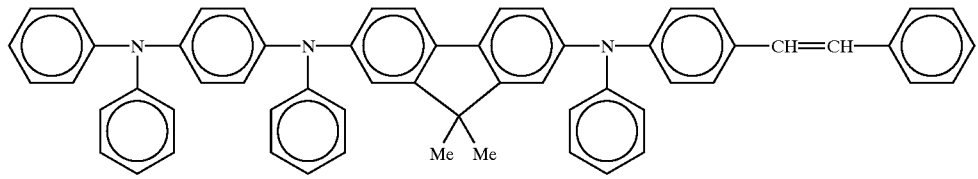
EM54

-continued
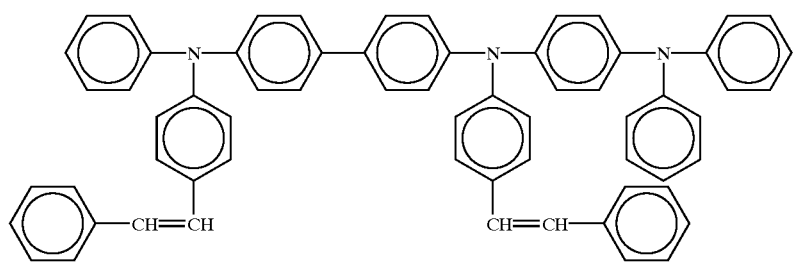
EM55
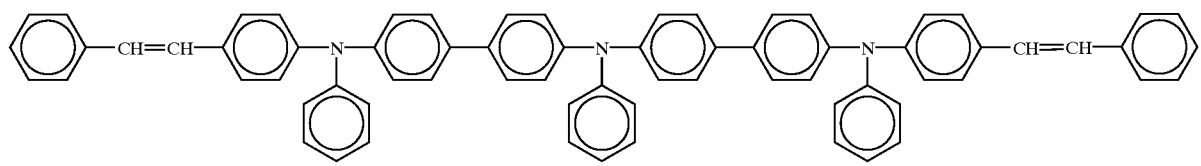
EM56
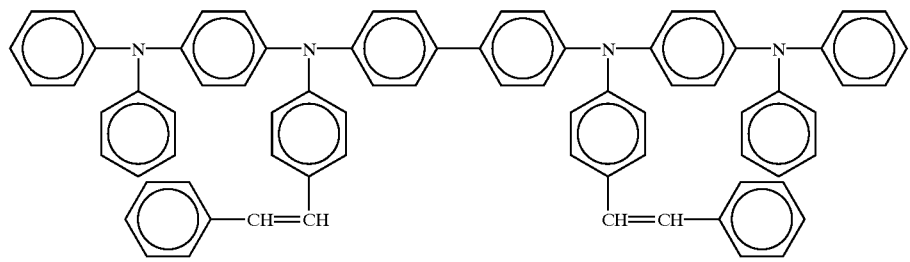
EM57
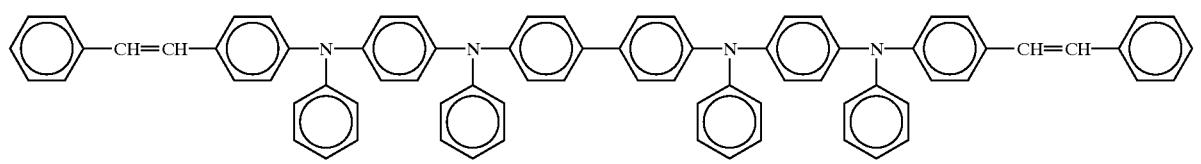
EM58
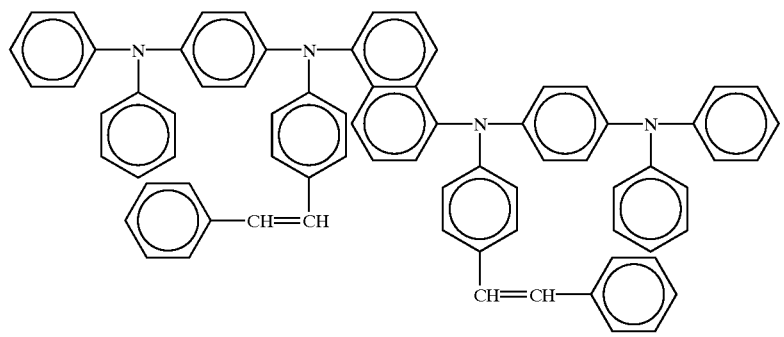
EM59
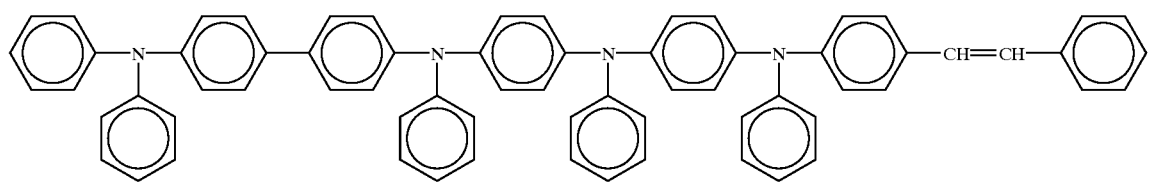
EM60
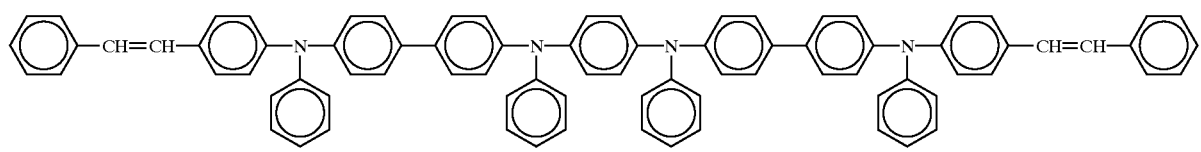
EM61

In the present invention, it is advantageous that the relative amounts of the styryl derivative containing amine of component (A) and the anthracene derivative of component (B) are suitably selected in accordance with the types of the used compounds so that the ratio by weight of component (A) to component (B) is in the range of 1:99 to 99:1. It is particularly preferable that, taking into consideration the fact that the compounds of component (A) have the hole transporting property and the compounds of component (B) have the electron transporting property, the relative amounts are selected so that the life and the efficiency of the obtained device are maximized. The voltage applied to the device can also be decreased by suitably selecting the relative amounts of component (A) and component (B).

In general, the preferable range of the ratio by weight of component (A) to component (B) is in the range of 2:98 to 9:91 and more preferably in the range of 3:97 to 5:95. A particularly high efficiency can be obtained within the above range. When a decrease in the voltage applied to the device is desired, it is preferable that the ratio by weight of component (A) to component (B) is in the range of 10:90 to 80:20.

It is preferable that the thickness of the layer of an organic light emitting medium is in the range of 5 to 200 nm. It is more preferable that the thickness is in the range of 10 to 40 nm since the voltage applied to the device can be remarkably decreased.

Due to the use of the combination of component (A) and component (B) for the layer of an organic light emitting medium, the efficiency can be increased to 3 to 5 times as high as the efficiency obtained by using component (B) alone and the life can be extended at least to 3 times and, when optimized, to 10 times or more as long as the life obtained by using component (B) alone.

Moreover, due to the use of the combination of component (A) and component (B), the layer of an organic light emitting medium becomes more amorphous and stability is improved. Therefore, more excellent heat resistance is exhibited. As the compound of component (B), a compound having a glass transition temperature of 110° C. or higher is preferable. As the compound of component (A), a compound having a glass transition temperature of 70° C. or higher is preferable. By using a mixture of the compounds having the above glass transition temperatures, the glass transition temperature of the layer of an organic light emitting medium can be kept at 90° C. or higher and a storage durability of 500 hours or longer at 85° C. can be obtained.

The organic EL device comprises a pair of electrodes and a layer of an organic light emitting medium (referred to as a light emitting medium layer, hereinafter) comprising a combination of component (A) and component (B) described above and disposed between the pair of electrodes. It is preferable that various intermediate layers are disposed between the electrodes and the light emitting medium layer. Examples of the intermediate layer include a hole injecting layer, a hole transporting layer, an electron injecting layer and an electron transporting layer. It is known that various organic and inorganic compounds can be used for these layers.

Typical examples of the construction of the organic EL device include:

(1) An anode/a light emitting medium layer/a cathode;
(2) An anode/a hole injecting layer/a light emitting medium layer/a cathode;
(3) An anode/a light emitting medium layer/an electron injecting layer/a cathode;
(4) An anode/a hole injecting layer/a light emitting medium layer/an electron injecting layer/a cathode;
(5) An anode/an organic semiconductor layer/a light emitting medium layer/a cathode;
(6) An anode/an organic semiconductor layer/an electron barrier layer/a light emitting medium layer/a cathode;
(7) An anode/an organic semiconductor layer/a light emitting medium layer/an adhesion improving layer/a cathode; and
(8) An anode/a hole injecting layer/a hole transporting layer/a light emitting medium layer/an electron injecting layer/a cathode. However, the construction of the organic EL device is not limited to the above examples.

In general, the organic EL device is prepared on a substrate which transmits light. The substrate which transmits light is the substrate which supports the organic EL device. It is preferable that the substrate which transmits light has a transmittance of light of 50% or greater in the visible region of 400 to 700 nm. It is also preferable that a flat and smooth substrate is used.

As the substrate which transmits light, glass plates and synthetic resin plates are advantageously used. Specific examples of the glass plates include plates made of soda ash glass, glass containing barium and strontium, lead glass, aluminosilicate glass, borosilicate glass, barium borosilicate glass and quartz. Specific examples of the synthetic resin plates include plates made of polycarbonate resins, acrylic resins, polyethylene terephthalate resins, polyether sulfide resins and polysulfone resins.

As the anode, an electrode made of a material such as a metal, an alloy, a conductive compound and a mixture of these materials which has a great work function (4 eV or more) is preferably used. Specific examples of the material for the anode include metals such as Au and conductive materials such as CuI, ITO (indium tin oxide), $SnO_2$, ZnO and In—Zn—O. The anode can be prepared by forming a thin film of the electrode material described above in accordance with a process such as the vapor deposition process and the sputtering process. When the light emitted from the light emitting medium layer is obtained through the anode, it is preferable that the anode has a transmittance of the emitted light greater than 10%. It is also preferable that the sheet resistivity of the anode is several hundred Ω/□ or smaller. The thickness of the anode is, in general, selected in the range of 10 nm to 1 μm and preferably in the range of 10 to 200 nm although the preferable range may be different depending on the used material.

As the cathode, an electrode made of a material such as a metal, an alloy, a conductive compound and a mixture of these materials which has a small work function (4 eV or smaller) is used. Specific examples of the material for the cathode include sodium, sodium-potassium alloys, magnesium, lithium, magnesium silver mixtures, aluminum/aluminum oxide, $Al/Li_2O$, $Al/LiO_2$, Al/LiF, aluminum-lithium alloys, indium and rare earth metals.

The cathode can be prepared by forming a thin film of the material described above in accordance with a process such as the vapor deposition process and the sputtering process.

When the light emitted from the light emitting medium layer is obtained through the cathode, it is preferable that the cathode has a transmittance of the emitted light greater than 10 %. It is also preferable that the sheet resistivity of the cathode is several hundred Ω/□ or smaller. The thickness of the cathode is, in general, selected in the range of 10 nm to 1 μm and preferably in the range of 50 to 200 nm.

In the organic EL device of the present invention, it is preferable that a layer of a chalcogenide, a metal halide or a metal oxide (this layer may occasionally be referred to as a surface layer) is disposed on the surface of at least one of the pair of electrodes prepared as described above. Specifically, it is preferable that a layer of a chalcogenide (including an oxide) of a metal such as silicon and aluminum is disposed on the surface of the anode at the side of the light emitting medium layer and a layer of a metal halide or a metal oxide is disposed on the surface of the cathode at the side of the light emitting medium layer. Due to the above layers, stability in driving can be improved.

Preferable examples of the chalcogenide include $SiO_x$ ($1 \leq x \leq 2$), $AlO_x$ ($1 \leq x \leq 1.5$), SiON and SiAlON. Preferable examples of the metal halide include LiF, $MgF_2$, $CaF_2$ and fluorides of rare earth metals. Preferable examples of the metal oxide include $Cs_2O$, $Li_2O$, MgO, SrO, BaO and CaO.

In the organic EL device of the present invention, the electron transporting property and the hole transporting property of the light emitting medium layer are simultaneously improved by suitably adjusting the relative amounts of component (A) and component (B) described above and the above intermediate layers such as the hole injecting layer, the hole transporting layer and the electron injecting layer can be omitted. In this case, the surface layers may be disposed. It is preferable that the surface layers are disposed.

In the organic EL device of the present invention, it is preferable that a mixed region of an electron transmitting compound and a reducing dopant or a mixed region of a hole transmitting compound and a oxidizing dopant is disposed on the surface of at least one of the pair of electrodes prepared as described above. Due to the mixed region disposed on the surface of the pair of electrodes, the electron transmitting compound is reduced to form an anion and injection and transportation of electrons from the mixed region into the light emitting medium can be facilitated. The hole transmitting compound is oxidized to form a cation and injection and transportation of holes from the mixed region into the light emitting medium is facilitated. Preferable examples of the oxidizing dopant include various types of Lewis acid and acceptor compounds. Preferable examples of the reducing dopant include alkali metals, compounds of alkali metals, alkaline earth metals, rare earth metals and compounds of these metals.

In the organic EL device of the present invention, the light emitting medium layer has the following functions:

(1) The injecting function: the function of injecting holes from the anode or the hole injecting layer and injecting electrons from the cathode or the electron injecting layer when an electric field is applied;

(2) The transporting function: the function of transporting injected charges (electrons and holes) by the force of the electric field; and (3) The light emitting function: the function of providing the field for recombination of electrons and holes and leading the recombination to the emission of light.

As the process for forming the light emitting medium layer, a conventional process such as the vapor deposition process, the spin coating process and the LB process can be used. It is particularly preferable that the light emitting medium layer is a molecular deposit film. The molecular deposit film is a thin film formed by deposition of a material compound in the gas phase or a thin film formed by solidification of a material compound in a solution or in the liquid phase. In general, the molecular deposit film can be distinguished from the thin film formed in accordance with the LB process (the molecular accumulation film) based on the differences in the aggregation structure and higher order structures and functional differences caused by these structural differences.

As disclosed in Japanese Patent Application Laid-Open No. Showa 57(1982)-51781, the light emitting medium layer can also be formed by dissolving a binder such as a resin and the material compounds into a solvent to prepare a solution, followed by forming a thin film from the prepared solution in accordance with the spin coating process or the like.

In the present invention, where desired, conventional light emitting media other than component (A) and component (B) described above may be comprised in the light emitting medium layer or a light emitting medium layer comprising other conventional light emitting media may be laminated to the light emitting medium layer comprising the compounds described in the present invention as long as the object of the present invention is not adversely affected.

The hole injecting and transporting layer is a layer which helps injection of holes into the light emitting medium layer and transports the holes to the light emitting region. The layer exhibits a great mobility of holes and, in general, has an ionization energy as small as 5.5 eV or smaller. For the hole injecting and transporting layer, a material which transports holes to the light emitting medium layer at a smaller electric field strength is preferable. A material which exhibits, for example, a mobility of holes of at least $10^{-6}$ $cm^2/V \cdot sec$ under application of an electric field of $10^4$ to $10^6$ V/cm is more preferable. A material can be selected from materials which are conventionally used as the charge transporting material of holes in photoconductive materials and conventional materials which are used for the hole injecting layer in organic EL devices and used as the hole injecting and transporting material.

To form the hole injecting and transporting layer, a thin film may be formed from a hole injecting and transporting material in accordance with a conventional process such as the vacuum vapor deposition process, the spin coating process, the casting process and the LB process. The thickness of the hole injecting and transporting layer is not particularly limited. In general, the thickness is 5 nm to 5 $\mu$m.

The electron injection layer is a layer which helps injection of electrons into the light emitting medium layer and exhibits a great mobility of electrons. The adhesion improving layer is an electron injecting layer made of a material exhibiting excellent adhesion with the cathode. As the material for the electron injecting layer, metal complexes of 8-hydroxyquinoline and derivatives thereof are preferably used. Specific examples of the metal complexes of 8-hydroxyquinoline and derivatives thereof include metal chelates of oxinoid compounds including chelates of oxine (in general, 8-quinolinol or 8-hydroxyquinoline). For example, tris(8-quinolinol)aluminum can be used as the electron injecting material.

To prepare the organic EL device of the present invention, for example, the anode, the light emitting medium layer and, where necessary, the hole injecting layer and the electron injecting layer are formed in accordance with the above process using the above materials and the cathode is formed in the last step. The organic EL device may be prepared by forming the above layers in the opposite order to that described above, i.e., the cathode being formed in the first step and the anode in the last step.

An embodiment of the process for preparing an organic EL device having a construction in which an anode, a hole injecting layer, a light emitting medium layer, an electron injecting layer and a cathode are disposed successively on a substrate which transmits light will be described in the following.

On a suitable substrate which transmits light, a thin film made of a material for the anode is formed in accordance with the vapor deposition process or the sputtering process so that the thickness of the formed thin film is 1 μm or smaller and preferably in the range of 10 to 200 nm. The formed thin film is used as the anode. Then, a hole injecting layer is formed on the anode. The hole injecting layer can be formed in accordance with the vacuum vapor deposition process, the spin coating process, the casting process or the LB process, as described above. The vacuum vapor deposition process is preferable because a uniform film can be easily obtained and the possibility of formation of pin holes is small. When the hole injecting layer is formed in accordance with the vacuum vapor deposition process, in general, it is preferable that the conditions are suitably selected in the following ranges: the temperature of the source of the deposition: 50 to 450° C.; the vacuum: $10^{-7}$ to $10^{-3}$ Torr; the rate of deposition: 0.01 to 50 nm/second; the temperature of the substrate: −50 to 300° C. and the thickness of the film: 5 nm to 5 μm; although the conditions of the vacuum vapor deposition are different depending on the used compound (the material for the hole injecting layer) and the crystal structure and the recombination structure of the hole injecting layer to be formed.

Then, the light emitting medium layer is formed on the hole injecting layer formed above. Using the light emitting medium described in the present invention, a thin film of the organic light emitting medium can be formed in accordance with the vacuum vapor deposition process, the sputtering process, the spin coating process or the casting process and the formed thin film is used as the light emitting medium layer. The vacuum vapor deposition process is preferable because a uniform film can be easily obtained and the possibility of formation of pin holes is small. When the light emitting medium layer is formed in accordance with the vacuum vapor deposition process, in general, the conditions of the vacuum vapor deposition process can be selected in the same ranges as those described for the vacuum vapor deposition of the hole injecting layer although the conditions are different depending on the used compound. It is preferable that the thickness is in the range of 10 to 40 nm.

An electron injecting layer is formed on the light emitting medium layer formed above. Similarly to the hole injecting layer and the light emitting medium layer, it is preferable that the electron injecting layer is formed in accordance with the vacuum vapor deposition process since a uniform film must be obtained. The conditions of the vacuum vapor deposition can be selected in the same ranges as those described for the vacuum vapor deposition of the hole injecting layer and the light emitting medium layer.

A cathode is formed on the above layers in the last step and an organic EL device can be obtained. The cathode is made of a metal and can be formed in accordance with the vacuum vapor deposition process or the sputtering process. It is preferable that the vacuum vapor deposition process is used in order to prevent formation of damages on the lower organic layers during the formation of the film.

In the above preparation of the organic EL device, it is preferable that the above layers from the anode to the cathode are formed successively while the preparation system is kept in a vacuum after being evacuated.

The electroluminescence device which can be prepared as described above emits light by applying a direct voltage of 3 to 40 V in the condition that the anode is connected to a positive electrode (+) and the cathode is connected to a negative electrode (−). When the connection is reversed, no electric current is observed and no light is emitted at all. When an alternating voltage is applied to the electroluminescence device, light emission is observed only in the condition that the polarity of the anode is positive and the polarity of the cathode is negative. When an alternating voltage is applied to the organic EL device, any type of wave shape can be used.

The present invention also provides the organic light emitting medium comprising component (A) and component (B) described above. The organic light emitting medium can be advantageously used for the organic EL device which exhibits excellent heat resistance, a long life and a high efficiency and emits bluish light.

The present invention will be described more specifically with reference to examples in the following. However, the present invention is not limited to the examples.

EXAMPLE 1

In accordance with known processes described in literatures, the following compounds Ant-1, TPD78, TPD107 and PAVB were synthesized and purified.

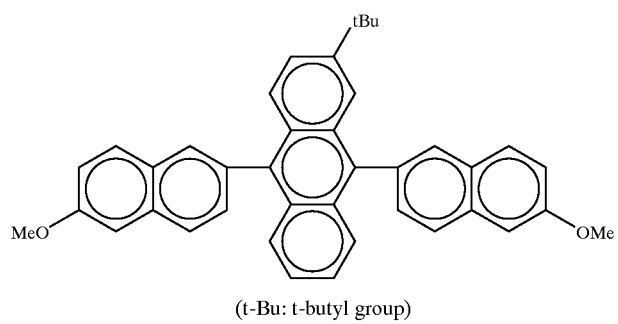

(Ant-1)

(t-Bu: t-butyl group)

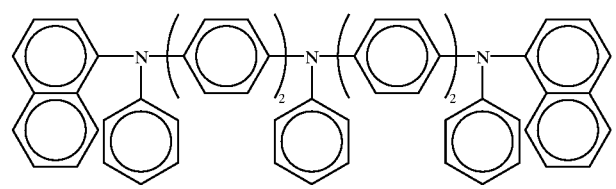

(TPD 78)

-continued

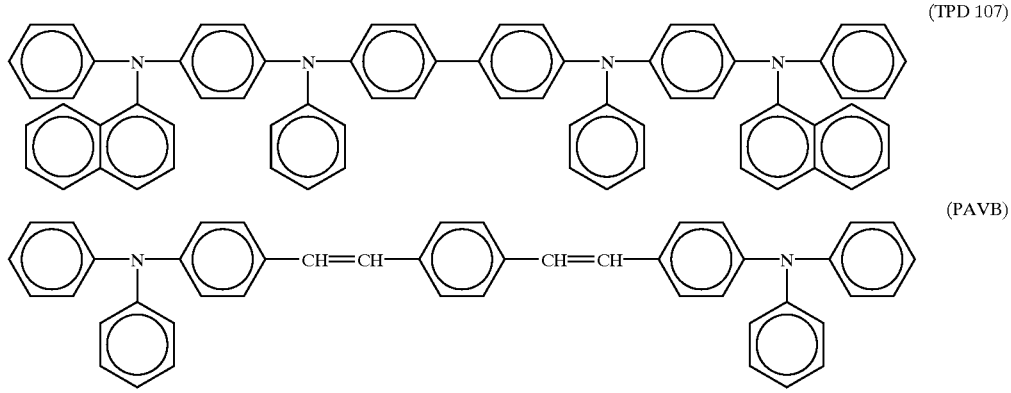

(TPD 107)

(PAVB)

On a glass plate having a size of 25×75×1.1 mm, a transparent electrode made of indium tin oxide and having a thickness of 120 nm was formed. After the glass substrate was irradiated with ultraviolet light, exposed to ozone and washed, the glass substrate was placed in a vacuum vapor deposition apparatus.

In the first step, TPD107 was vapor deposited so that a layer having a thickness of 60 nm was formed and TPD78 was vapor deposited so that a layer having a thickness of 20 nm was formed on the layer of TPD107. Then, Ant-1 and PAVB were simultaneously vapor deposited on the formed layers in amounts such that the ratio by weight of Ant-1 and PAVB was 40:3 and a light emitting medium layer having a thickness of 30 nm was formed.

Alq (an aluminum complex of 8-hydroxyquinoline) was vapor deposited so that a layer having a thickness of 20 nm was formed on the formed light emitting medium layer. The layers of TPD107, TPD78, Ant-1/PAVB and Alq were the hole injecting layer, the hole transporting layer, the light emitting medium layer and the electron injecting layer, respectively.

Then, LiF was vapor deposited so that a layer having a thickness of 0.3 nm was formed on the above layers and aluminum was vapor deposited so that a layer having a thickness of 100 nm was formed on the layer of LiF. The layers of LiF and Al worked as the cathode. An organic EL device was prepared as described above.

The device was tested by passing an electric current. Blue light emission of 110 cd/m² was obtained at a voltage of 5 V and a current density of 1.05 mA/cm². The efficiency was 10.4 cd/A.

The device was tested by continuously passing direct current at a current density of 10 mA/cm² and the half-life was found to be 1100 hours.

EXAMPLES 2 to 16

Organic EL devices were prepared in accordance with the same procedures as those conducted in Example 1 except that the light emitting medium layer was formed from a compound of component (A) and a compound of component (B) shown in Table 1 in amounts shown in Table 1.

The properties of the obtained organic EL devices are shown in Table 1.

TABLE 1

| | Organic light emitting medium layer | | | | |
|---|---|---|---|---|---|
| | component (A) | component (B) | (A):(B) (ratio by weight) | Voltage (V) | Current density (mA/cm²) |
| Example 2 | EM43 | EM22 | 3:40 | 6 | 4.25 |
| Example 3 | EM44 | EM22 | 3:30 | 6 | 3.79 |
| Example 4 | EM50 | EM25 | 6:30 | 6 | 6.25 |
| Example 5 | EM51 | EM28 | 8:40 | 6 | 7.02 |
| Example 6 | EM43 | EM2 | 2:40 | 6 | 3.80 |
| Example 7 | EM44 | EM4 | 3:20 | 6 | 4.90 |
| Example 8 | EM50 | EM7 | 4:30 | 6 | 5.20 |
| Example 9 | EM51 | EM9 | 2:98 | 6 | 7.20 |
| Example 10 | EM32 | EM27 | 3:40 | 6 | 6.20 |
| Example 11 | EM36 | EM27 | 3:30 | 6 | 7.50 |
| Example 12 | EM39 | EM27 | 6:30 | 6 | 6.50 |
| Example 13 | EM39 | EM7 | 8:40 | 6 | 7.48 |
| Example 14 | EM44 | EM7 | 2:40 | 6 | 4.92 |
| Example 15 | EM52 | EM7 | 2:98 | 6 | 5.64 |
| Example 16 | EM53 | EM7 | 2:40 | 6 | 3.82 |

| | Luminance (cd/m²) | Efficiency (cd/A) | Half-life under driving at constant current of 10 mA/cm² (hour) |
|---|---|---|---|
| Example 2 | 410 | 9.6 | 1350 |
| Example 3 | 390 | 10.2 | 1400 |
| Example 4 | 550 | 8.8 | 850 |
| Example 5 | 620 | 8.8 | 1100 |
| Example 6 | 430 | 11.3 | 2100 |
| Example 7 | 510 | 10.4 | 2400 |
| Example 8 | 490 | 9.4 | 1800 |
| Example 9 | 650 | 9.0 | 1300 |
| Example 10 | 480 | 7.7 | 1100 |
| Example 11 | 650 | 8.7 | 920 |
| Example 12 | 600 | 9.2 | 870 |
| Example 13 | 810 | 10.8 | 2200 |
| Example 14 | 650 | 13.2 | 2100 |
| Example 15 | 600 | 10.6 | 1900 |
| Example 16 | 430 | 11.3 | 1400 |

EXAMPLE 17

A device was prepared in accordance with the same procedures as those conducted in Example 1 except that a mixed layer composed of EM43 and EM2 in amounts such that the ratio by weight of EM43 to EM2 was 3:30 was used as the light emitting medium layer and layers of Alq:Cs and Al were used as the cathode in place of layers of LiF and Al. The layer of Alq:Cs was a layer of a mixture of Alq which was an electron transmitting compound and Cs metal which was a reducing dopant in amounts such that the ratio by mole of Alq to Cs was 1:1. Blue light emission of 120 cd/m² was obtained at a voltage of 4.5 V and a current density of 1.03 mA/cm². The light emission could be achieved at a small applied voltage. The efficiency was as high as 11.7 cd/A. The half-life under driving at a constant current of 10 mA/cm² was 2200 hours.

EXAMPLE 18

An organic EL device was prepared in accordance with the same procedures as those conducted in Example 1 except that EM37 and EM21 were used as component (A) and component (B), respectively, of the light emitting medium layer in amounts such that the ratio by weight of EM37 to EM21 was 2:3. An electric current of 3.25 mA/cm² was obtained at a voltage of 5 V and blue light was emitted at an efficiency of 4.9 cd/A. The device was tested by continuously passing direct current at a current density of 10 mA/cm² and the half-life was found to be as long as 3200 hours. The applied voltage could be further decreased by increasing the amount of component (A).

COMPARATIVE EXAMPLE 1

An organic EL device was prepared in accordance with the same procedures as those conducted in Example 1 except that PAVB which was a styryl derivative containing amine was not vacuum vapor deposited simultaneously.

The properties of the prepared device was evaluated. A current of 0.8 mA/cm² was passed at a voltage of 5 V but the luminance was as low as 22 cd/rn². The efficiency was 2.75 cd/A. Therefore, the efficiency obtained in Example 1 was 3.8 times as high as that obtained in Comparative Example 1. The device was tested by continuously passing direct current at a current density of 10 mA/cm² and the half-life was found to be as short as 200 hours.

INDUSTRIAL APPLICABILITY

In accordance with the present invention, an organic EL device exhibiting excellent heat resistance, a long life and a high efficiency and emitting blue light can be provided.

The organic EL device can be advantageously used as the light emitting device in various types of display apparatuses.

What is claimed is:

1. An organic electroluminescence device which comprises a pair of electrodes and a layer of an organic light emitting medium which is disposed between the pair of electrodes and comprises (A) at least one compound selected from the group consisting of monostyryl derivatives containing amine, distyryl derivatives containing amine, tristyryl derivatives containing amine and tetrastyryl derivatives containing amine and (B) at least one compound selected from the group consisting of anthracene derivatives represented by general formula (I):

$$A^1—L—A^2 \tag{I}$$

wherein $A^1$ and $A^2$ each represent a substituted or unsubstituted monophenylanthryl group or a substituted or unsubstituted diphenylanthryl group and may be the same or different from each other and L represents a single bond or a divalent linking group; and anthracene derivatives represented by general formula (II):

$$A^3—An—A^4 \tag{II}$$

wherein An represents a substituted or unsubstituted divalent anthracene residue group and $A^3$ and $A^4$ each represent a substituted or unsubstituted monovalent condensed aromatic ring group or a substituted or unsubstituted non-condensed ring aryl group having 12 or more carbon atoms and may be the same with or different from each other, and when any of An, $A^3$ and $A^4$ has a substituent, it is selected from the group consisting of alkyl groups having 1 to 6 carbon atoms, cycloalkyl groups having 3 to 6 carbon atoms, alkoxy groups having 1 to 6 carbon atoms, aryloxy groups having 5 to 18 carbon atoms, aralkyloxy groups having 7 to 18 carbon atoms, amino groups substituted with aryl groups having 5 to 16 carbon atoms, nitro group, cyano group, ester groups having 1 to 6 carbon atoms and halogen atoms.

2. An organic electroluminescence device according to claim 1, wherein the anthracene derivatives represented by general formula (I) of component (B) are anthracene derivatives represented by general formula (I-a):

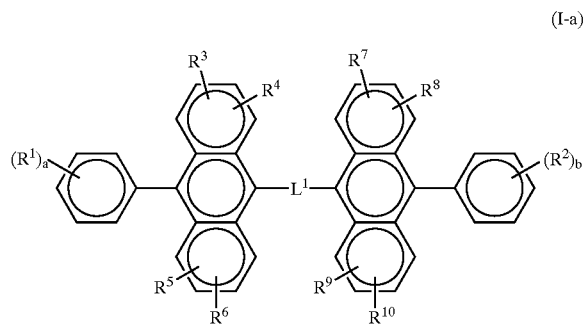

(I-a)

wherein $R^1$ to $R^{10}$ each independently represent hydrogen atom, an alkyl group, a cycloalkyl group, an aryl group which may be substituted, an alkoxy group, an aryloxy group, an alkylamino group, arylamino group or a heterocyclic group which may be substituted; a and b each represent an integer of 1 to 5; when any of a and b represents an integer of 2 or greater, a plurality of $R^1$ or $R^2$ may be the same with or different from each other and a plurality of $R^1$ or $R^2$ may be bonded to each other to form a ring; $R^3$ and $R^4$, $R^5$ and $R^6$, $R^7$ and $R^8$, and $R^9$ and $R^{10}$ may be bonded to each other to form rings; and $L^1$ represents a single bond, —O—, —S—, —N(R)— or an arylene group, R representing an alkyl group or an aryl group which may be substituted; and anthracene derivatives represented by general formula (I-b):

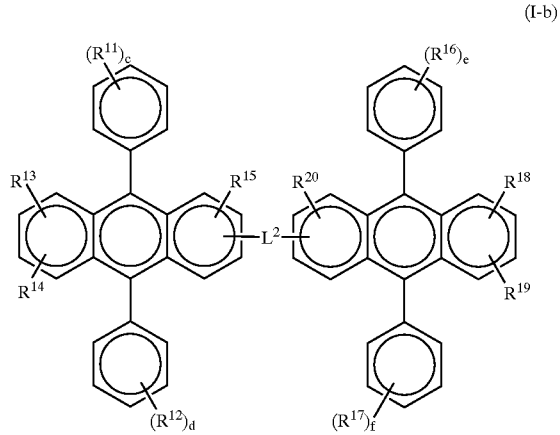

(I-b)

wherein $R^{11}$ to $R^{20}$ each independently represent hydrogen atom, an alkyl group, a cycloalkyl group, an aryl group, an alkoxy group, an aryloxy group, an alkylamino group, an arylamino group or a heterocyclic group which may be substituted; c, d, e and f each represent an integer of 1 to 5; when any of c, d, e and f represents an integer of 2 or greater, a plurality of $R^{11}$, $R^{12}$, $R^{16}$ or $R^{17}$ may be the same with or different from each other and a plurality of $R^{11}$, $R^{12}$, $R^{16}$ or $R^{17}$ may be bonded to each other to form a ring; $R^{13}$ and $R^{14}$, and $R^{18}$ and $R^{19}$ may be bonded to each other to form rings; $L^2$ represents a single bond, —O—, —S—, —N(R)— or an arylene group, R representing an alkyl group or an aryl group which may be substituted.

3. An organic electroluminescence device according to claim 1, wherein the anthracene derivatives represented by general formula (II) of component (B) are anthracene derivatives represented by general formula (II-a):

  (II-a)

wherein An represents a substituted or unsubstituted divalent anthracene residue group and $Ar^1$ and $Ar^2$ each independently represent a substituted or unsubstituted monovalent residue group derived from naphthalene, phenanthrene, anthracene, pyrene, perylene, coronene, chrysene, picene, fluorene, terphenyl, diphenylanthracene, biphenyl, N-alkylcarbazole, N-arylcarbazole, triphenylene, rubicene, benzoanthracene or dibenzoanthracene.

4. An organic electroluminescence device according to claim 1, wherein component (A) is at least one compound selected from the group consisting of styryl derivatives containing amine represented by general formula (III):

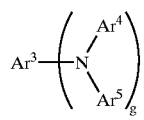  (III)

wherein $Ar^3$, $Ar^4$ and $Ar^5$ each independently represent a substituted or unsubstituted aromatic group having 6 to 40 carbon atoms, at least one of the groups represented by $Ar^3$, $Ar^4$ and $Ar^5$ contains styryl group, g represents an integer of 1 to 4 and a total number of styryl group is 1 to 4; and styryl derivatives containing amine represented by general formula (IV):

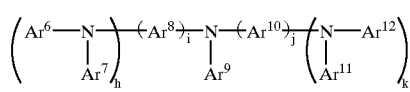  (IV)

wherein $Ar^6$, $Ar^7$, $Ar^9$, $Ar^{11}$ and $Ar^{12}$ each independently represent a substituted or unsubstituted monovalent aromatic group having 6 to 40 carbon atoms, $Ar^8$ and $Ar^{10}$ each independently represent a substituted or unsubstituted divalent aromatic group having 6 to 40 carbon atoms, at least one of the groups represented by $A^6$ to $A^{12}$ contains styryl group or styrylene group, h and k each represent an integer of 0 to 2, i and j each represent an integer of 1 or 2 and a total number of styryl group and styrylene group is 1 to 4.

5. An organic electroluminescence device according to claim 1, wherein the layer of an organic light emitting medium comprises component (A) and component (B) in amounts such that a ratio by weight of component (A) to component (B) is 2:98 to 9:91.

6. An organic electroluminescence device according to claim 1, wherein a layer of a chalcogenide, a metal halide or a metal oxide is disposed on a surface of at least one of the pair of electrodes.

7. An organic electroluminescence device according to claim 1, wherein a mixed region of a reducing dopant and an organic compound or a mixed region of an oxidizing dopant and an organic compound is disposed on a surface of at least one of the pair of electrodes.

8. An organic electroluminescence device according to claim 1, wherein the layer of an organic light emitting medium has a thickness of 10 to 40 nm.

9. An organic light emitting medium which comprises (A) at least one compound selected from the group consisting of monostyryl derivatives containing amine, distyryl derivatives containing amine, tristyryl derivatives containing amine and tetrastyryl derivatives containing amine and (B) at least one compound selected from the group consisting of anthracene derivatives represented by general formula (I) and anthracene derivatives represented by general formula (II)

$$A^1L—A^2 \qquad (I)$$

wherein $A^1$ and $A^2$ each represent a substituted or unsubstituted monophenylanthryl group or a substituted or unsubstituted diphenylanthryl group and may be the same or different from each other and L represents a single bond or a divalent linking group, $$A^3—An—A^4 \qquad (II)$$

wherein An represents a substituted or unsubstituted divalent anthracene residue group and $A^3$ and $A^4$ each represent a substituted or unsubstituted monovalent condensed aromatic ring group or a substituted or unsubstituted monovalent non-condensed ring aryl group having 12 or more carbon atoms and may be the same with or different from each other, and when any of An, $A^3$ and $A^4$ has a substituent, it is selected from the group consisting of alkyl groups having 1 to 6 carbon atoms, cycloalkyl groups having 3 to 6 carbon atoms, alkoxy groups having 1 to 6 carbon atoms, aryloxy groups having 5 to 18 carbon atoms, aralkyloxy groups having 7 to 18 carbon atoms, amino groups substituted with aryl groups having 5 to 16 carbon atoms, nitro group, cyano group, ester groups having 1 to 6 carbon atoms and halogen atoms.

* * * * *